United States Patent
Chen et al.

(10) Patent No.: US 10,931,239 B2
(45) Date of Patent: Feb. 23, 2021

(54) AMPLIFICATION CIRCUIT

(71) Applicant: RichWave Technology Corp., Taipei (TW)

(72) Inventors: Chih-Sheng Chen, Taipei (TW); Chang-Yi Chen, Taipei (TW)

(73) Assignee: RichWave Technology Corp., Taipei (TW)

(*) Notice: Subject to any disclaimer, the term of this patent is extended or adjusted under 35 U.S.C. 154(b) by 38 days.

(21) Appl. No.: 16/273,077

(22) Filed: Feb. 11, 2019

(65) Prior Publication Data
US 2020/0059199 A1    Feb. 20, 2020

(30) Foreign Application Priority Data

Aug. 17, 2018 (TW) .................... 107128710

(51) Int. Cl.
| | |
|---|---|
| *H03F 1/02* | (2006.01) |
| *H03F 3/193* | (2006.01) |
| *H03F 1/56* | (2006.01) |
| *H03F 3/21* | (2006.01) |

(52) U.S. Cl.
CPC ........... *H03F 1/0233* (2013.01); *H03F 1/565* (2013.01); *H03F 3/193* (2013.01); *H03F 3/21* (2013.01); *H03F 2200/294* (2013.01); *H03F 2200/372* (2013.01); *H03F 2200/451* (2013.01)

(58) Field of Classification Search
USPC ........................................ 330/250, 285, 296
See application file for complete search history.

(56) References Cited

U.S. PATENT DOCUMENTS

| | | | |
|---|---|---|---|
| 7,049,891 B2 | 5/2006 | Yuen | |
| 10,469,032 B2 * | 11/2019 | Namie | .................. H03F 1/0211 |
| 10,608,606 B2 * | 3/2020 | Lee | ...................... H03G 3/3042 |
| 2003/0020545 A1 | 1/2003 | Joly | |
| 2010/0127781 A1 * | 5/2010 | Inamori | ................ H03F 1/0261 |
| | | | 330/296 |

FOREIGN PATENT DOCUMENTS

| | | |
|---|---|---|
| TW | 200826479 | 6/2008 |
| TW | 201001903 A1 | 1/2010 |

* cited by examiner

*Primary Examiner* — Hieu P Nguyen
(74) *Attorney, Agent, or Firm* — Winston Hsu

(57) ABSTRACT

An amplification circuit includes an input terminal for receiving a radio frequency input signal, an output terminal for outputting an amplified radio frequency signal, a bias circuit for providing a bias voltage, an impedance circuit, a transistor, and a filter circuit. The impedance circuit is coupled to the bias circuit and the input terminal, and provides a voltage drop between the first terminal and the second terminal of the impedance circuit. The first transistor has a first terminal coupled to the output terminal, a second terminal coupled to a first reference voltage terminal, and a control terminal coupled to the impedance circuit and for receiving the radio frequency input signal. The filter circuit is coupled to the first transistor and the impedance circuit, filters out a harmonic signal, and provides a feedback signal including a primary frequency signal of the amplified radio frequency signal to the impedance circuit.

13 Claims, 2 Drawing Sheets

AMPLIFICATION CIRCUIT

CROSS REFERENCE TO RELATED APPLICATION

This application claims priority of Taiwan application No. 107128710, which was filed on Aug. 17, 2018, and is included herein by reference.

TECHNICAL FIELD

The present invention is related to an amplification circuit, and more particularly, to an amplification circuit capable of preserving linearity in a high power mode.

BACKGROUND

Amplifiers are usually used to amplify signals to improve signal quality for both signal transmission and signal reception in wireless communications. However, since the environment in which wireless communications is located may change at any moment, the power required by the amplifier may also change correspondingly. When the amplifier operates in a high power node, the amplifier may draw a larger current from the bias circuit. Also, if the amplifier continues to operate in a relative high power mode, the temperature of the amplifier will rise gradually, resulting in drawing more current from the bias circuit. Consequently, the amplifier may eventually be damaged due to overheating.

To protect the bias circuit from generating excessive currents in the high power mode and causing damages to the amplifier, a protection circuit is usually added in the bias circuit. However, in prior art, the protection circuit will pull the 1 dB compression point (P1 dB) of the overall amplification gain backwards, reducing the power range in which the amplifier is able to preserve the desired linearity, and lowering the performance of the amplifier. That is, designers often have to compromise between circuit protection and amplifier performance, and have difficulty in achieving these two goals at the same time.

SUMMARY

One embodiment of the present invention discloses an amplification circuit used in an amplification device. The amplification circuit includes an input terminal, an output terminal, a bias circuit, an impedance circuit, a first transistor, and a filter circuit.

The input terminal receives a radio frequency input signal. The output terminal outputs an amplified radio frequency signal. The bias circuit provides a bias voltage. The impedance circuit has a first terminal coupled to the bias circuit, and a second terminal coupled to the input terminal, and the impedance circuit provides a voltage drop between the first terminal and the second terminal of the impedance circuit. The first transistor has a first terminal coupled to the output terminal, a second terminal coupled to a first reference voltage terminal, and a control terminal coupled to the second terminal of the impedance circuit for receiving the radio frequency input signal. The filter circuit is coupled to the first terminal of the first transistor and the impedance circuit. The filter circuit filters out a harmonic signal and provides a feedback signal to the impedance circuit. The feedback signal includes a primary frequency signal of the amplified radio frequency signal.

DETAILED DESCRIPTION

Figure 1:
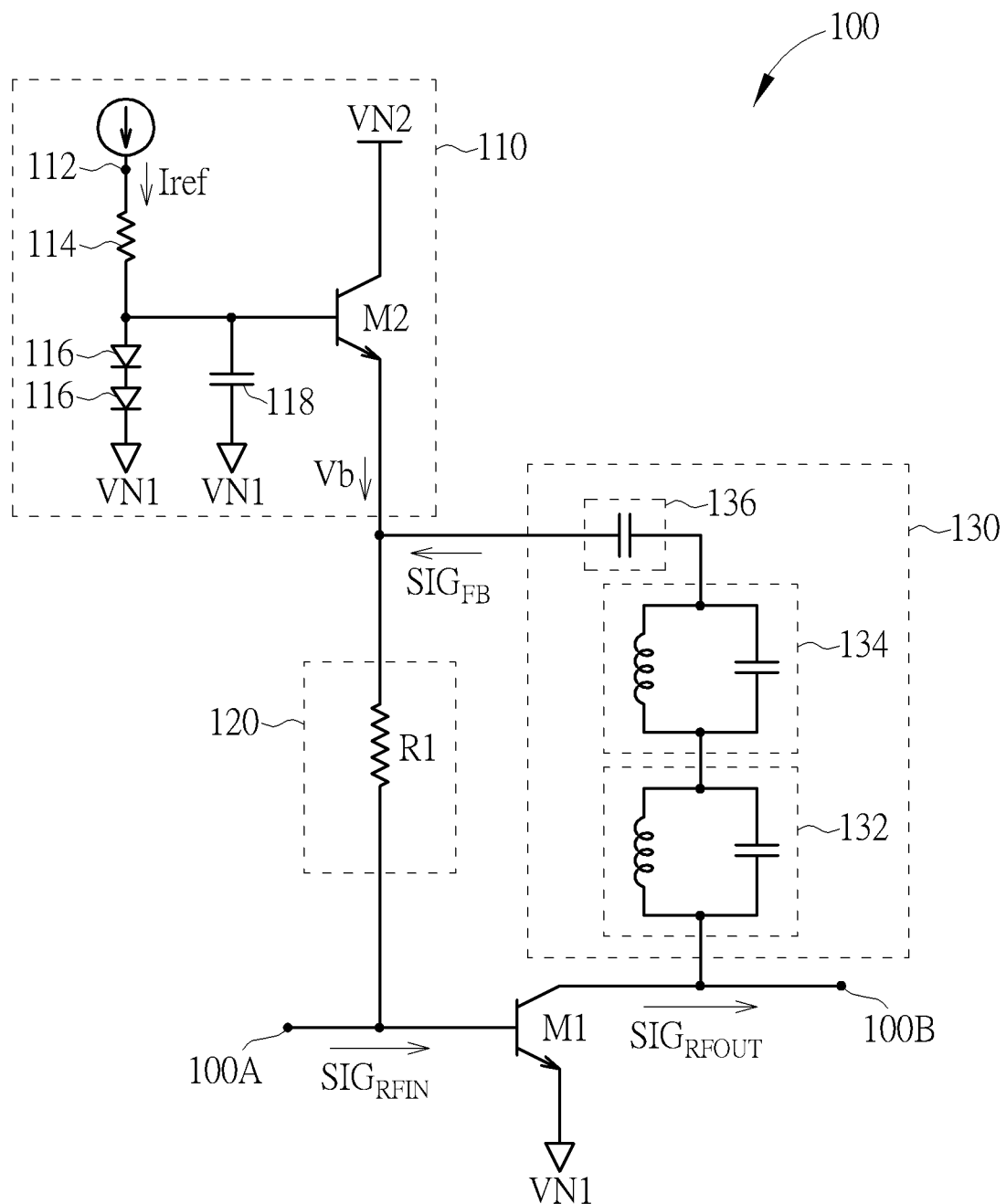
FIG. 1 shows an amplification circuit according to one embodiment of the present invention.

Below, exemplary embodiments will be described in detail with reference to accompanying drawings so as to be easily realized by a person having ordinary knowledge in the art. The inventive concept maybe embodied in various forms without being limited to the exemplary embodiments set forth herein. Descriptions of well-known parts are omitted for clarity, and like reference numerals refer to like elements throughout.

FIG. 1 shows an amplification circuit 100 according to one embodiment of the present invention. The amplification circuit 100 includes an input terminal 100A, an output terminal 100B, a bias circuit 110, an impedance circuit 120, a first transistor M1 and a filter circuit 130. The input terminal 100A can receive a radio frequency (RF) input signal $SIG_{RFIN}$, and the amplification circuit 100 can amplify the RF input signal $SIG_{RFIN}$ and output the amplified RF signal $SIG_{RFOUT}$ through the output terminal 100B. In some embodiments of the present invention, the amplifying circuit 100 can be a Low Noise Amplifier (LNA) or a Power Amplifier (PA), and can be applied to an amplifier device that transmits a wireless signal. In some embodiments of the present invention, the amplifying circuit 100 may be one of the plurality of stages of the amplifier device.

The bias circuit 110 can provide a bias voltage Vb. In FIG. 1 the bias circuit 110 can, for example, include a reference power supply terminal 112, a resistor 114, at least one diode 116, a capacitor 118, and a second transistor M2. The reference power supply terminal 112 can be coupled to a reference power supply for receiving the power required by the bias circuit 110. In some embodiments of the present invention, the reference power supply can be, for example, a reference current source for outputting a reference current Iref. However, in some other embodiments, the reference power supply can also be a voltage source for providing a reference voltage. In some embodiments, there can be a plurality of diodes 116. The resistor 114 has a first terminal coupled to the reference power supply terminal 112, and a second terminal. The diodes 116 are coupled in series between the second terminal of the resistor 114 and a first reference voltage terminal VN1. The capacitor 118 has a first terminal coupled to the second terminal of the resistor 114, and a second terminal coupled to the first reference voltage terminal VN1. The second transistor M2 has a first terminal coupled to a second reference voltage terminal VN2, a second terminal coupled to the filter circuit 130 and the impedance circuit 120 for outputting the bias voltage Vb, and a control terminal coupled to the second terminal of the resistor 114. The voltage of the second reference voltage terminal VN2 can be larger than the first reference voltage terminal VB1. For example, the voltage of the second reference voltage terminal VN2 can be, for example but not limited to, an operation voltage of the system, and the voltage of the first reference voltage terminal VN1 can be, for example but not limited to, a ground voltage of the system.

In the present embodiment, the resistor 114 and the plurality of diodes 116 can keep the control terminal of the second transistor M2 at a desired operation voltage. Also, the rectifying characteristic of the diodes 116 can further protect the control terminal of the second transistor M2. In addition, the capacitor 118 can guide the high frequency signals to the first reference voltage node VN1 to enable the second transistor M2 to output a steady bias voltage Vb.

The impedance circuit 120 has a first terminal coupled to the bias circuit 110, and a second terminal coupled to the input terminal 100A of the amplification circuit 100. The impedance circuit 120 can provide a corresponding voltage drop between the first terminal and the second terminal of the impedance circuit 120 according to the current flowing through the impedance circuit 120. In the embodiment shown in FIG. 1, the impedance circuit 120 can include at least one resistor R1.

The first transistor M1 has a first terminal coupled to the output terminal 100B, a second terminal coupled to the first reference voltage terminal VN1, and a control terminal coupled to the second terminal of the impedance circuit 120 for receiving the RF input signal $SIG_{RFIN}$.

In some embodiments of the present invention, according to the bias voltage Vb provided by the bias voltage circuit 110, the first transistor M1 can amplify the RF input signal $SIG_{RFIN}$ received by its control terminal and output the amplified RF signal $SIG_{RFOUT}$ through its first terminal. That is, the first transistor M1 can actually be regarded as the amplifier of the amplification circuit 100 substantially.

Generally, when the amplification circuit 100 operates at a relatively high power, the swing of the RF input signal $SIG_{RFIN}$ would also be larger. However, due to the characteristic of the reverse-biased diode which is formed by the control terminal and the second terminal of the second transistor M2, the downward swing of the voltage at the input terminal 100A of the amplification circuit 100 would be clamped while the upward swing of the voltage would not. Therefore, on average, the voltage at the input terminal 100A of the amplification circuit 100 will rise when the amplification circuit 100 operates at a relatively high power.

In this case, the first transistor M1 can generate a larger current correspondingly to meet the high power requirement. In order to prevent the first transistor M1 from being damaged due to the excessive current caused by an excessive voltage swing at the input terminal 100A, the impedance circuit 120 can provide a greater voltage drop between the control terminal of the first transistor M1 and the second terminal of the second transistor M2, preventing the voltage at the control terminal of the first transistor M1 from being too large and generating an excessive current, and so as to protect the first transistor M1.

However, to prevent the impedance circuit 120 from weakening the magnitude of the current increase and narrowing down the power range in which the amplification circuit 100 is able to preserve the desired linearity, the amplification circuit 100 can generate a feedback signal $SIG_{FB}$ through the filter circuit 130 for broaden the power range in which the amplification circuit 100 is able to preserve the desired linearity. In some embodiments, the filter circuit 130 can be coupled to the first terminal of the first transistor M1 and the impedance circuit 120. Therefore, the filter circuit 130 can generate the feedback signal $SIG_{FB}$ according to the amplified RF signal $SIG_{RFOUT}$ outputted by the first terminal of the first transistor M1, and send the feedback signal $SIG_{FB}$ to the first terminal of the impedance circuit 120.

The amplified RF signal $SIG_{RFOUT}$ may induce harmonic signals after being amplified by the first transistor M1. Therefore, in some embodiments of the present invention, the filter circuit 130 can suppress or filter out the harmonic signals in the amplified RF signal $SIG_{RFOUT}$ to generate the feedback signal $SIG_{FB}$. That is, the feedback signal $SIG_{FB}$ can mainly include the primary frequency signal of the amplified radio frequency signal $SGI_{RFOUT}$.

In FIG. 1, the filter circuit 130 can include a first band stop filter 132 and a second band stop filter 134. The second band stop filter 134 and the first band stop filter 132 can be coupled in series. The first band stop filter 132 can filter out a first harmonic signal of the amplified RF signal $SIG_{RFOUT}$, and the second band stop filter 134 can filter out a second harmonic signal of the amplified RF signal $SIG_{RFOUT}$. The first harmonic signal and the second harmonic signal can be harmonic signals of different orders. During the process of the RF signals amplification by the first transistor M1, the $N^{th}$ order harmonic signal may be easily induced, where N is positive integer greater than 1. In this case, the first band stop filter 132 and the second band stop filter 134 can be designed to filter out harmonic signals of different orders of the amplified RF signal $SIG_{RFOUT}$, for example, but not limited to, filter out the second order harmonic signal and the third order harmonic signal of the amplified RF signal $SIG_{RFOUT}$.

In FIG. 1, the first band stop filter 132 and the second band stop filter 134 can include inductors and capacitors. The inductor and capacitor coupled in parallel can help to suppress signals in corresponding bands. However, the present invention does not limit the manner in which the first band stop filter 132 and the second band stop filter 134 are implemented. In some other embodiments, the first band stop filter 132 and the second band stop filter 134 can also use other elements or other connecting structures to achieve the filtering function. Alternatively, the band stop filter can also be a notch filter.

In addition, in FIG. 1, the filter circuit 130 can further include a direct current blocking circuit 136, the direct current blocking circuit 136 can be coupled to the impedance circuit 120, and can be coupled in series with the first band stop filter 132 and the second band stop filter 134. The direct current blocking circuit 136 can include, for example, at least one capacitor for preventing the direct current between the first transistor M1 and the bias circuit 110 from affecting the operation of the amplification circuit 100.

Consequently, the amplification circuit 100 can protect the first transistor M1 with the impedance circuit 120, and provide the proper feedback signal $SIG_{FB}$ by the filter circuit 130 to broaden the power range in which the amplifier is able to preserve the desired linearity.

Furthermore, the present invention does not limit the number of band stop filters included in the filter circuit 130. In some embodiments, the designer can include more band stop filters to suppress other harmonic signals in other bands in the filter circuit 130, or use only one band stop filter to suppress the harmonic signal that is the most significant.

Figure 2:
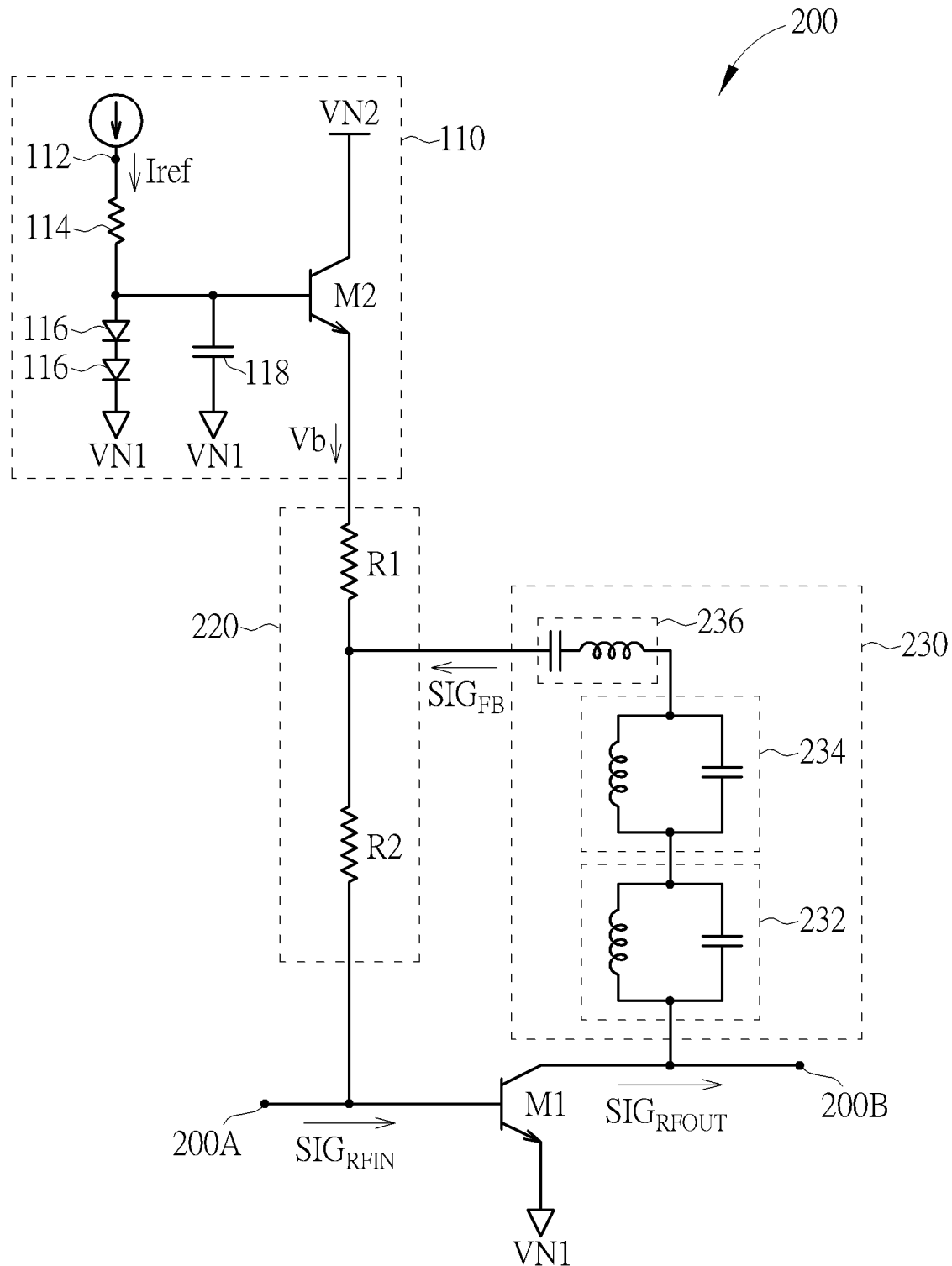
FIG. 2 shows an amplification circuit according to another embodiment of the present invention.

In some embodiments, the filter circuit 130 can obtain the primary frequency signal of the amplified RF signal $SIG_{RFOUT}$ with a band pass filter, which can also replace the direct current blocking circuit 136. FIG. 2 shows an amplification circuit 200 according to one embodiment of the present invention. The amplification circuits 100 and 200 have similar structures and can be operated with similar principles. That is, the amplification circuit 200 can receive the RF input signal $SIG_{RFIN}$ through the input terminal 200A, amplify the RF input signal $SIG_{RFIN}$, and output the amplified RF signal $SIG_{RFOUT}$ through the output terminal 200B.

However, the filter circuit 230 of the amplification circuit 200 can include a first band stop filter 232, a second band stop filter 234, and a band pass filter 236. The band pass filter 236 can be coupled between the impedance circuit 220 and the first band stop filter 232, and can pass the primary frequency signal of the amplified RF signal $SIG_{RFOUT}$. That is, with the first band stop filter 232, the second band stop filter 234 and the band pass filter 236, the noises in the amplified RF signal $SIG_{RFOUT}$ that does not belong to the primary frequency signal can be further suppressed to enable the amplification circuit 200 to maintain a better linearity.

In FIG. 2, the band pass filter 236 can, for example, include an inductor and a capacitor, and suppress signals of the corresponding band with the inductor and capacitor coupled in series. However, this is not to limit the scope of the present invention. In some other embodiments, the band pass filter 236 can also use other elements or other connecting structures to achieve the filtering function.

However, in some embodiments, if the band pass filter 236 is able to suppress the harmonic signals in the amplified RF signal $SIG_{RFOUT}$ effectively, the filter circuit 230 may also omit the first band stop filter 232 and the second band stop filter 234, or omit one of the first band stop filter 232 and the second band stop filter 234.

In addition, in FIG. 2, the impedance circuit 220 can include a first resistor R1 and a second resistor R2. The resistor R1 has a first terminal coupled to the first terminal of the impedance circuit 220, and a second terminal coupled to the filter circuit 230. The resistor R2 has a first terminal coupled to the second terminal of the first resistor R1, and a second terminal coupled to the second terminal of the impedance circuit 220. That is, the feedback signal $SIG_{FB}$ is not limited to being provided to the second terminal of the second transistor M2 as shown in FIG. 1. In fact, the designer can also choose to provide the feedback signal $SIG_{FB}$ to other appropriate impedance nodes in the impedance circuit 220 according to the requirements of the actual circuit.

In summary, the amplification circuits provided by the embodiments of the present invention can protect the first transistor with the impedance circuit, and provide the proper feedback signals to broaden the power range in which the amplification circuit is able to preserve the linearity and suppress noises in the amplified signals with the filter circuit. That is, the amplification circuits provided by the embodiments of the present invention can protect the internal components from being damaged while maintaining the desired gain performance, so that the quality of signal transmission is more stable.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An amplification circuit used in an amplification device, the amplification circuit comprising:
   an input terminal configured to receive a radio frequency input signal;
   an output terminal configured to output an amplified radio frequency signal;
   a bias circuit configured to provide a bias voltage;
   an impedance circuit having a first terminal coupled to the bias circuit, and a second terminal coupled to the input terminal, and configured to provide a voltage drop between the first terminal and the second terminal of the impedance circuit;
   a first transistor having a first terminal coupled to the output terminal, a second terminal coupled to a first reference voltage terminal, and a control terminal coupled to the second terminal of the impedance circuit, and configured to receive the radio frequency input signal; and
   a filter circuit coupled to the first terminal of the first transistor and the impedance circuit, and configured to filter out a harmonic signal and provide a feedback signal to the impedance circuit;
   wherein the feedback signal comprises a primary frequency signal of the amplified radio frequency signal.

2. The amplification circuit of claim 1, wherein the impedance circuit comprises at least one resistor.

3. The amplification circuit of claim 1, wherein the impedance circuit comprises:
   a first resistor having a first terminal coupled to the first terminal of the impedance circuit, and a second terminal coupled to the filter circuit; and
   a second resistor having a first terminal coupled to the second terminal of the first resistor, and a second terminal coupled to the second terminal of the impedance circuit.

4. The amplification circuit of claim 1, wherein the filter circuit comprises a first band stop filter configured to filter out a first harmonic signal of the amplified radio frequency signal.

5. The amplification circuit of claim 4, wherein the first band stop filter comprises an inductor and a capacitor.

6. The amplification circuit of claim 4, wherein the filter circuit further comprises a band pass filter coupled between the impedance circuit and the first band stop filter, and configured to pass the primary frequency signal of the amplified radio frequency signal.

7. The amplification circuit of claim 6, wherein the band pass filter comprises an inductor and a capacitor.

8. The amplification circuit of claim 4, wherein the filter circuit further comprises a second band stop filter coupled in series with the first band stop filter, and configured to filter out a second harmonic signal of the amplified radio frequency signal.

9. The amplification circuit of claim 8, wherein the filter circuit further comprises a band pass filter coupled between the impedance circuit and the first band stop filter, and configured to pass the primary frequency signal of the amplified radio frequency signal.

10. The amplification circuit of claim 9, wherein the band pass filter comprises an inductor and a capacitor.

11. The amplification circuit of claim 4, wherein the filter circuit further comprises a direct current blocking circuit coupled to the impedance circuit and coupled in series with the first band stop filter.

12. The amplification circuit of claim 11, wherein the direct current blocking circuit comprises a capacitor.

13. The amplification circuit of claim 1, wherein the bias circuit comprises:
   a reference power supply terminal;
   a resistor having a first terminal coupled to the reference power supply terminal, and a second terminal;
   at least one diode coupled in series between the second terminal of the resistor and the first reference voltage terminal;
   a capacitor having a first terminal coupled to the second terminal of the resistor, and a second terminal coupled to the first reference voltage terminal; and
   a second transistor having a first terminal coupled to a second reference voltage terminal, a second terminal coupled to the filter circuit and the impedance circuit and configured to output the bias voltage, and a control terminal coupled to the second terminal of the resistor;

wherein the second reference voltage terminal has a larger voltage than the first reference voltage terminal.

* * * * *